United States Patent
Blank et al.

(10) Patent No.: US 9,349,629 B2
(45) Date of Patent: May 24, 2016

(54) TOUCH AUTO-CALIBRATION OF PROCESS MODULES

(71) Applicant: Lam Research Corporation, Fremont, CA (US)

(72) Inventors: Richard M. Blank, San Jose, CA (US); Peter S. Thaulad, San Jose, CA (US); Jacob Lee Hiester, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 47 days.

(21) Appl. No.: 14/162,566

(22) Filed: Jan. 23, 2014

(65) Prior Publication Data

US 2015/0202774 A1  Jul. 23, 2015

(51) Int. Cl.
*H01L 21/68* (2006.01)
*H01L 21/673* (2006.01)
*H01L 21/677* (2006.01)
*H01L 21/687* (2006.01)

(52) U.S. Cl.
CPC .............. *H01L 21/68* (2013.01); *H01L 21/673* (2013.01); *H01L 21/67742* (2013.01); *H01L 21/681* (2013.01); *G05B 2219/45031* (2013.01); *G05B 2219/50026* (2013.01); *H01L 21/68707* (2013.01)

(58) Field of Classification Search
CPC .............. H01L 21/68; H01L 21/6835; H01L 21/68707; H01L 21/673; H01L 21/67778; H01L 21/681; H01L 21/67742; Y10S 414/136; Y10S 156/942; B25J 19/02; G05B 2219/45031; G05B 2219/50026
USPC ......... 700/254, 258, 261, 262; 901/30, 35, 45
See application file for complete search history.

(56) References Cited

U.S. PATENT DOCUMENTS

| | | | |
|---|---|---|---|
| 5,975,986 A | 11/1999 | Allen et al. | |
| 6,242,879 B1 * | 6/2001 | Sagues et al. | 318/567 |
| 6,296,546 B1 * | 10/2001 | Allen et al. | 451/5 |
| 6,323,616 B1 | 11/2001 | Sagues et al. | |
| 6,729,462 B2 * | 5/2004 | Babbs et al. | 198/346.2 |
| 6,869,266 B2 * | 3/2005 | Coomer | H01L 21/6838 414/627 |
| 6,996,456 B2 * | 2/2006 | Cordell | B25J 9/1692 219/124.34 |
| 8,181,688 B2 * | 5/2012 | Johnson et al. | 156/752 |
| 8,764,026 B2 * | 7/2014 | George et al. | 279/106 |
| 2002/0048506 A1 * | 4/2002 | Babbs et al. | 414/783 |
| 2002/0094260 A1 * | 7/2002 | Coomer | H01L 21/6838 414/416.09 |
| 2003/0198547 A1 * | 10/2003 | Coomer | H01L 21/6838 414/416.09 |
| 2004/0078114 A1 * | 4/2004 | Cordell | B25J 9/1692 700/258 |
| 2005/0137751 A1 * | 6/2005 | Cox et al. | 700/245 |

* cited by examiner

*Primary Examiner* — Jason Holloway
(74) *Attorney, Agent, or Firm* — Weaver Austin Villeneuve & Sampson LLP

(57) ABSTRACT

Methods and systems for the touch auto-calibration for robot placement of substrate in process modules are provided. Touch auto-calibration allows for the automatic calibration of robot end effector positioning with respect to an aligning base in a process module. Touch auto-calibration also allows for calibration of process modules at temperatures and pressures similar to the temperatures and pressures experienced during production. The end effector has one or more aligning surfaces configured to align it with the aligning base upon contact with the aligning base. After contact, the position of the end effector and the calibrated position of the end effector during a pick or place move can then be determined. In some implementations, the positioning of the end effector as it transfers a substrate during production is based on a placement coordinate with the placement correction applied.

20 Claims, 11 Drawing Sheets

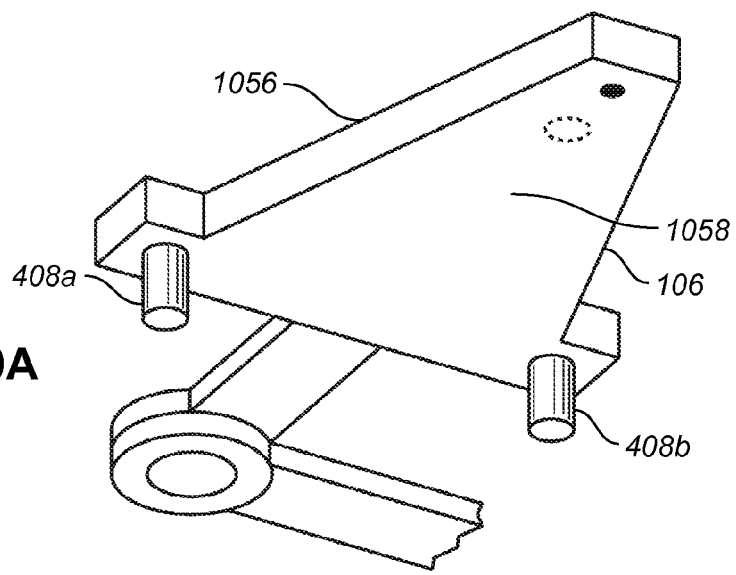
Fig. 10A
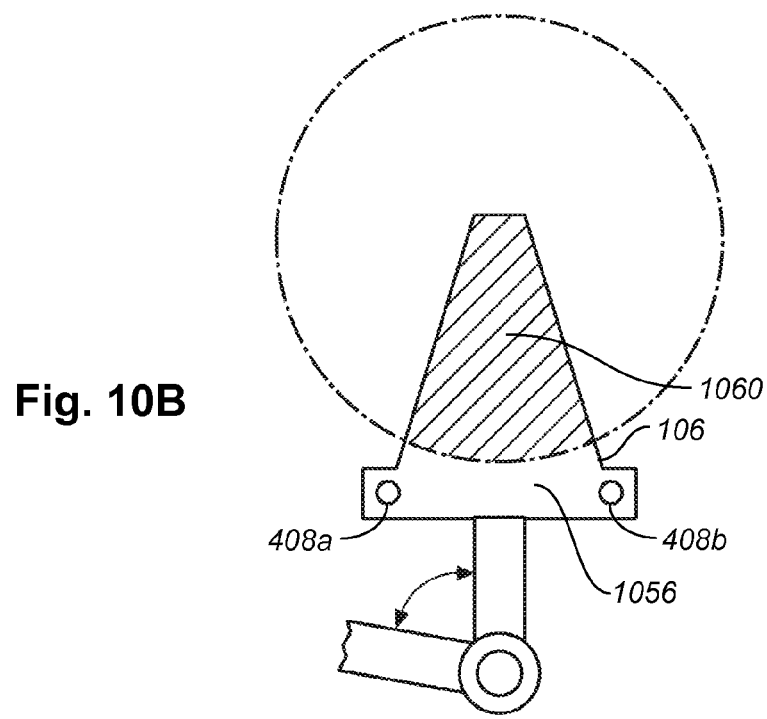
Fig. 10B
Fig. 10

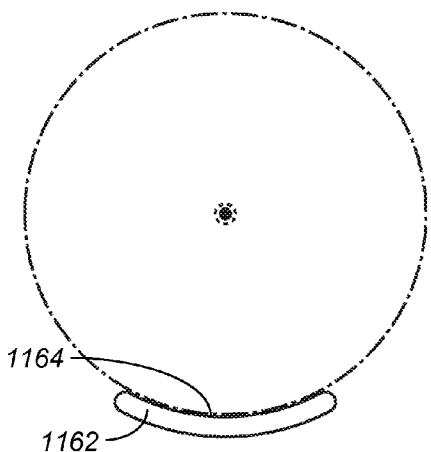
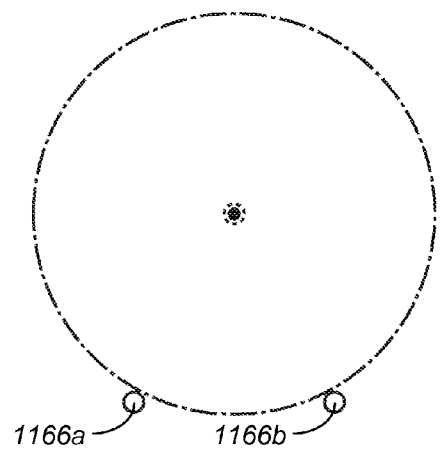
FIG. 11A
FIG. 11B
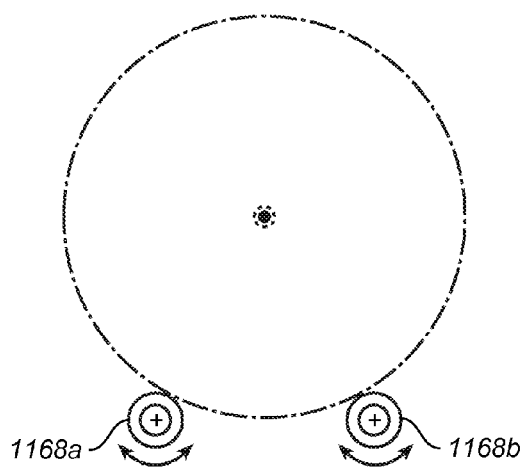
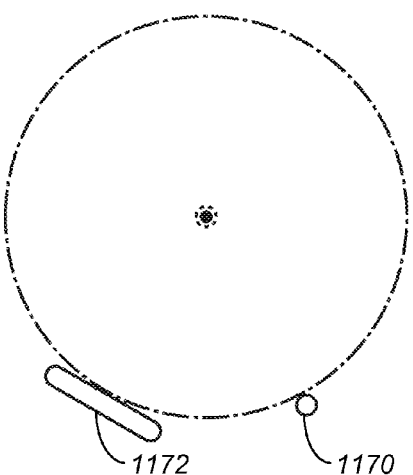
FIG. 11C
FIG. 11D
Fig. 11

TOUCH AUTO-CALIBRATION OF PROCESS MODULES

BACKGROUND

Different types of tools are used to perform hundreds of processing operations during semiconductor device fabrication. Most of these operations are performed in vacuum chambers at very low pressure. Substrates, such as semiconductor wafers, are introduced to the process chambers and placed on semiconductor wafer pedestals within the process chambers with wafer handling systems that are mechanically coupled to the process chambers. The wafer handling systems transfer semiconductor wafers from the factory floor to semiconductor wafer pedestals within the process chambers. These systems include loadlocks to bring the semiconductor wafers from atmospheric conditions to very low pressure conditions and back, and robots to transfer the semiconductor wafers to various positions. Accurate orientation of the semiconductor wafers on the semiconductor wafer pedestals is critical to ensure wafers are free of defects. Calibration of the wafer handling systems would also benefit from greater repeatability in the calibration process to ensure consistently accurate calibrations. There is a need for more accurate and repeatable calibration of the wafer handling systems to decrease the number of defects on the semiconductor wafers.

SUMMARY

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale unless specifically indicated as being scaled drawings.

In some implementations, a method for use with semiconductor processing equipment may be provided. The method may include moving an end effector with one or more aligning surfaces towards an aligning base until all of the one or more aligning surfaces are contacting the aligning base, measuring a torque value applied by a motor operable to move the end effector, detecting contact of all of the one or more aligning surfaces with the aligning base from the torque value, determining a placement coordinate of the end effector when all of the one or more aligning surfaces are contacting the aligning base, and determining a substrate transfer position for the end effector using the placement coordinate.

In some implementations of the method, determining the substrate transfer position includes applying a placement correction to the placement coordinate. In some such implementations, the placement correction includes an angular component. In some other or additional such implementations, the placement correction includes a linear component.

In some other or additional such implementations, the calculation for the placement correction further includes using a temperature value. In some such implementations, the placement correction is calculated using a temperature value different from the ambient temperature when the method was performed.

In some other or additional such implementations, the end effector may be moved by the placement correction. In some other or additional implementations, the end effector has two or more aligning surfaces. In some other or additional implementations, the end effector has two and only two aligning surfaces. In some other or additional implementations, the one or more aligning surfaces contact the aligning base only at tangent planes to the aligning base.

In some other or additional implementations, contact is detected from measuring a change in the torque value. In some other or additional implementations, contact is detected from measuring a 50-1,000% increase in the torque value. In some other or additional implementations, the method is performed at an ambient temperature between 40 to 500 degrees Celsius. In some other or additional implementations, the method is performed at sub-atmospheric pressures. In some other or additional implementations, the aligning base is connected to a pedestal. In some other or additional implementations, the aligning base is substantially circular. In some other or additional implementations, the aligning base is connected to a semiconductor wafer pedestal. The method further includes placing a substrate on the semiconductor wafer pedestal with the end effector at a location determined by applying the placement correction to the placement coordinate.

In some implementations, an apparatus for use with semiconductor processing equipment may be provided. The apparatus may include an aligning base, an end effector, the end effector including one or more aligning surfaces such that the one or more aligning surfaces are configured to contact the aligning base, a motor such that the motor is operable to move the end effector, a sensor such that the sensor is configured to measure a torque value of the motor used to move the end effector and output the torque value, and a controller comprising program instructions. The program instructions may include code for moving the end effector toward the aligning surfaces, code for receiving a torque value outputted by the sensor, code for detecting that contact is made by all of the one or more aligning surfaces with the aligning base based on the torque value, code for determining a placement coordinate of the end effector, and code for determining a substrate transfer position for the end effector using the placement coordinate.

In some implementations of the apparatus, the end effector has two or more aligning surfaces. In some other or additional implementations, the end effector is configured to hold a substrate. In some such implementations, the end effector has a first area configured for placement of the substrate and the aligning surfaces are outside the first area. In some other or additional such implementations, the aligning surfaces are pins extending away from a first surface configured to hold the substrate. In some other or additional such implementations, the aligning surfaces are protrusions extending away from a first surface configured to hold the substrate.

In some other or additional such implementations, the aligning surfaces are configured to contact the aligning base during an alignment sequence, guide the end effector into a placement during the alignment sequence, and be outside a first area on the end effector wherein the first area is configured to lie over the aligning base when the end effector is holding the substrate. In some other or additional implementations, the aligning surfaces are bearings.

In some other or additional implementations, determining the substrate transfer position includes applying a placement correction to the placement coordinate. In some such implementations, the program instructions include code for moving the end effector by the placement correction. In some other or additional such implementations, the placement correction includes a linear component. In some other or additional such implementations, the placement correction includes an angular component. In some other or additional such implementations, the placement correction further includes a temperature component.

In some other or additional implementations, the aligning base is connected to a semiconductor wafer pedestal. In some other or additional implementations, the apparatus further includes a semiconductor wafer pedestal and a process station. The aligning base is connected to the semiconductor wafer pedestal, the semiconductor pedestal is a part of the process station, and the aligning base, semiconductor wafer pedestal, process station, end effector, motor, sensor, and controller forms a semiconductor process tool.

In some implementations, an apparatus for use with semiconductor processing equipment may be provided. The apparatus may include an arm including an end effector at the end, a motor operable to move the arm, and a sensor which measures a torque value of the motor used to move the arm. The end effector may include an attaching end configured to interface with the arm, a first area configured to hold and support the substrate, and one or more aligning surfaces outside the first area configured to contact an aligning base during an alignment sequence, guide the end effector into a placement during the alignment sequence, and be outside a second area on the end effector wherein the second area is configured to lie over the aligning base when the end effector is holding the substrate.

In some implementations of the apparatus, the end effector has two or more aligning surfaces. In some other or additional implementations, the end effector is configured to hold a substrate. In some other or additional implementations, the aligning surfaces are protrusions extending away from a first surface configured to hold the substrate. In some other or additional implementations, the aligning surfaces are bearings. In some other or additional implementations, the arm further includes a substrate aligning feature to align the substrate's position with the end effector. In some other or additional implementations, the aligning surfaces include two surfaces configured to contact the aligning base only at tangent planes to the aligning base.

In some implementations, a method for use with semiconductor processing equipment may be provided. The method may include moving an end effector with one or more aligning surfaces towards a commanded position, measuring an actual position of the end effector, detecting contact of all of the one or more aligning surfaces with an aligning base from the difference between the commanded position and the actual position, determining a placement coordinate of the end effector when all of the one or more aligning surfaces are contacting the aligning base, and determining a substrate transfer position for the end effector using the placement coordinate.

BRIEF DESCRIPTION OF THE DRAWINGS

FIGS. 10A and 10B show an example of an end effector with aligning surfaces used in a touch auto-calibration method.

FIGS. 11A-11D are examples of various different aligning surface configurations for end effectors used in touch auto-calibration.

DETAILED DESCRIPTION

Figure 1:
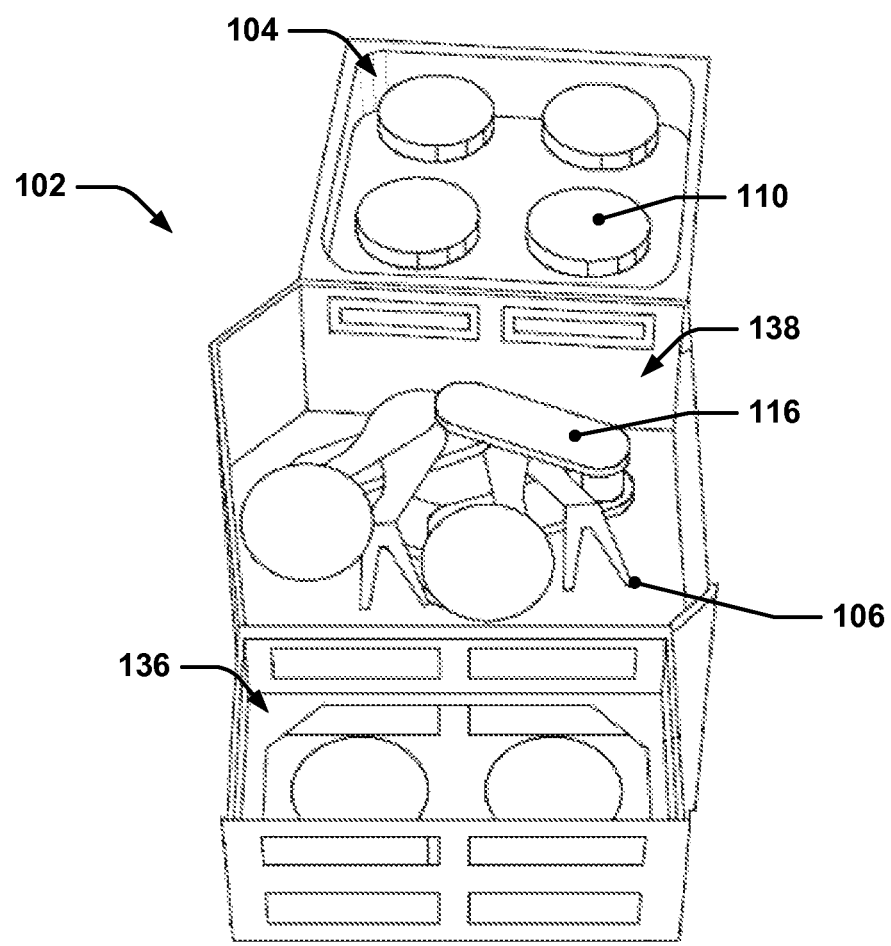
FIG. 1 is an example of a semiconductor process tool having a touch auto-calibration system.

Accurate placement of substrates such as semiconductor wafers in locations such as process modules is important to ensure uniform processing across the substrate. Substrates are generally placed into process modules by transfer robots supporting the substrates on their end effectors. For a transfer robot to accurately place a substrate, the position of the end effector with respect to the process module is calibrated before the placement is carried out.

Current end effector calibration techniques require complicated fixtures such as special pedestal rings, dowels, or special semiconductor wafers. These fixtures are bulky, need prolonged set-up procedures, and require that calibration be performed with an open semiconductor process chamber. Thus, current techniques allow calibration at only atmospheric pressures and room temperatures. Semiconductor process chambers often operate at pressures much lower than atmospheric and at elevated temperatures. Therefore, post-calibration corrections for pressure and temperature variations may be required for accurate placement. The current best practice is to visually determine these corrections.

Touch auto-calibration allows for quick and accurate calibration of an end effector to transfer substrates to and from a location such as a semiconductor process chamber. Touch auto-calibration allows a semiconductor process tool to automatically calibrate the placement of an end effector of a robot arm to an aligning base, such as a pedestal in a process chamber. The end effector has one or more aligning surfaces configured to align the end effector with the aligning base upon contact with the aligning base. After contact, a placement coordinate of the end effector is determined and a placement correction can be calculated. In some implementations, the position of the end effector as it transfers a substrate to and from a process chamber during production is based on the placement coordinate with the placement correction applied.

Touch auto-calibration allows for calibration of an end effector without fixtures. Since no fixtures are required, calibration can be performed at the pressure and temperature of the actual production process or in environments where the pressure and temperature more closely approximate the conditions of the actual production process, simplifying the corrections needed (if any) to compensate for environmental factors. Set-up of fixtures is also eliminated, saving time and complication. Additionally, since the end effector is calibrated to the same datum points during each round of calibration, touch auto-calibration is highly repeatable, leading to highly consistent calibrations of the orientation of the semiconductor wafer by the end effector on the semiconductor wafer pedestal.

In some embodiments, the one or more aligning surfaces of an end effector and the aligning base automatically align the end effector's position, simplifying the calculation of the placement correction. Certain implementations of touch auto-calibration include aligning surfaces that are configured so that the aligning surfaces contact the aligning base only during the calibration process. During production, there is no contact between the aligning surfaces and the aligning base, minimizing particle generation.

FIG. 1 is an example of a semiconductor process tool having a touch auto-calibration system. The semiconductor process tool 102 shown in FIG. 1 may be used to process substrates, such as semiconductor wafers of any dimension including 300 mm diameter semiconductor wafers and 450 mm diameter semiconductor wafers. Transfer module 138, loadlock 136, and process module 104 are the main components of semiconductor process tool 102 shown in FIG. 1. Transfer module 138 contains a dual-armed robot including robot arm 116 and end effector 106. Process module 104 contains multiple semiconductor wafer pedestals including semiconductor wafer pedestal 110. Transfer module 138 is in communication with process module 104 and loadlock 136. In certain implementations, process module 104 may process substrates at sub-atmospheric pressures and/or at high temperatures, such as temperatures between 40 and 500 degrees Celsius.

Figure 4:
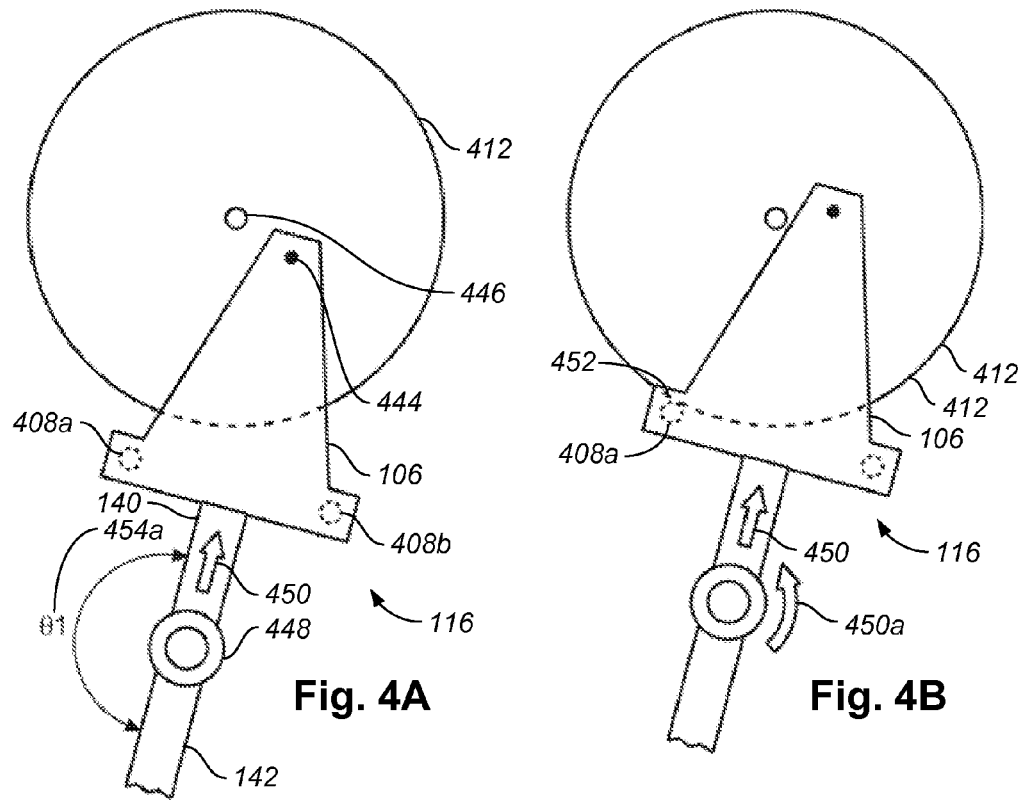
FIGS. 4A-4D is a graphical representation of a certain implementation of a robot arm with an end effector containing aligning surfaces and an aligning base at certain stages of touch auto-calibration.
Figure 4:
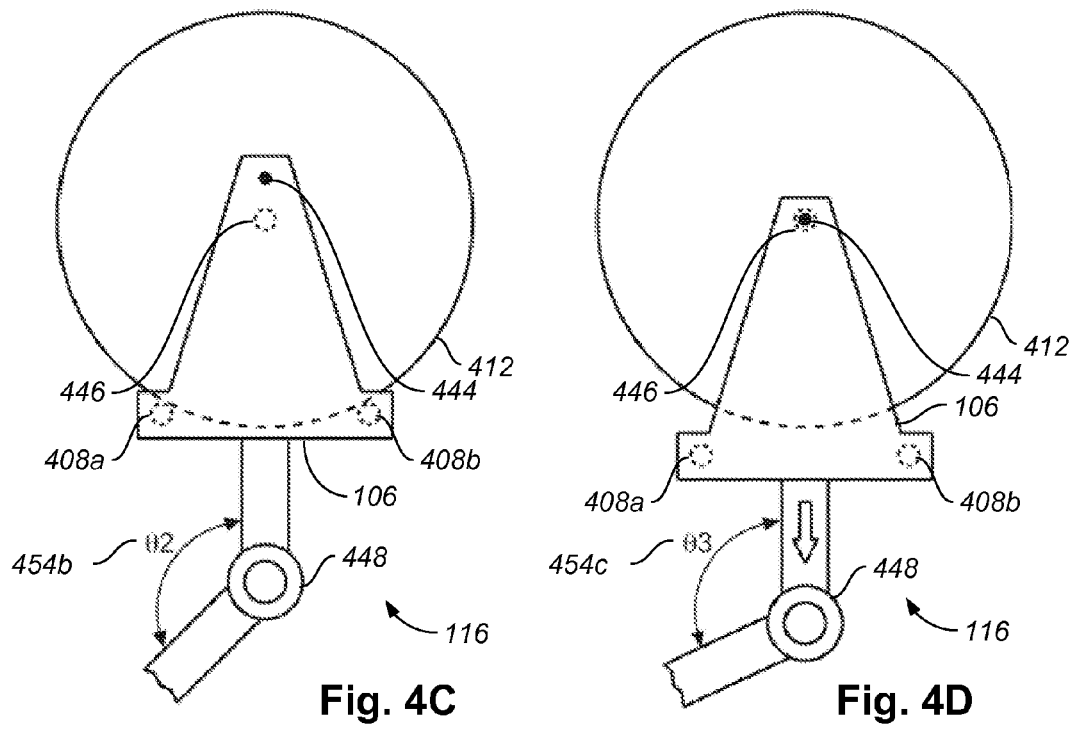

Transfer module 138 in FIG. 1 is configured to transfer substrates from loadlock 136 to process module 104 and back again. When process module 104 is at sub-atmospheric pressure, transfer module 138 may be maintained at the sub-atmospheric pressure as well. When process module 104 is at sub-atmospheric pressure, substrates may be placed in loadlock 136 for pump-down when transitioning between atmospheric and sub-atmospheric environments before they are introduced into process module 104 by robot arm 116. Robot arm 116 is configured to pick substrates from loadlock 136 and position the substrates on semiconductor wafer pedestal 110 in process module 104 for processing. For robot arm 116 to accurately place substrates on semiconductor wafer pedestal 110, the touch auto-calibration methods and systems described herein may be used to calibrate robot arm 116 and end effector 106 relative to semiconductor wafer pedestal 110. Semiconductor wafer pedestal 110 may be configured to support an aligning base, described in FIG. 4. After substrates are processed, robot arm 116 may pick the substrates from semiconductor wafer pedestal 110 in process module 104 and place them in loadlock 136.

In various implementations, transfer module 138 may contain a robot including one, two, or more robot arms, each of which may have one or more end effectors. Also in various implementations, process module 104 may contain two or more semiconductor wafer pedestals for processing multiple substrates. Loadlock 136 may be configured to accept multiple substrates for transfer at one time. Further, while only one process module 104 is depicted in FIG. 1, multiple single-station or multi-station process modules may be connected to transfer module 138. Touch auto-calibration as disclosed herein may be used to calibrate the positioning of each robot end effector with respect to each semiconductor wafer pedestal. Touch auto-calibration may further be employed for calibration with respect to wafer supports within loadlock 136 or other wafer station.

Figure 2:
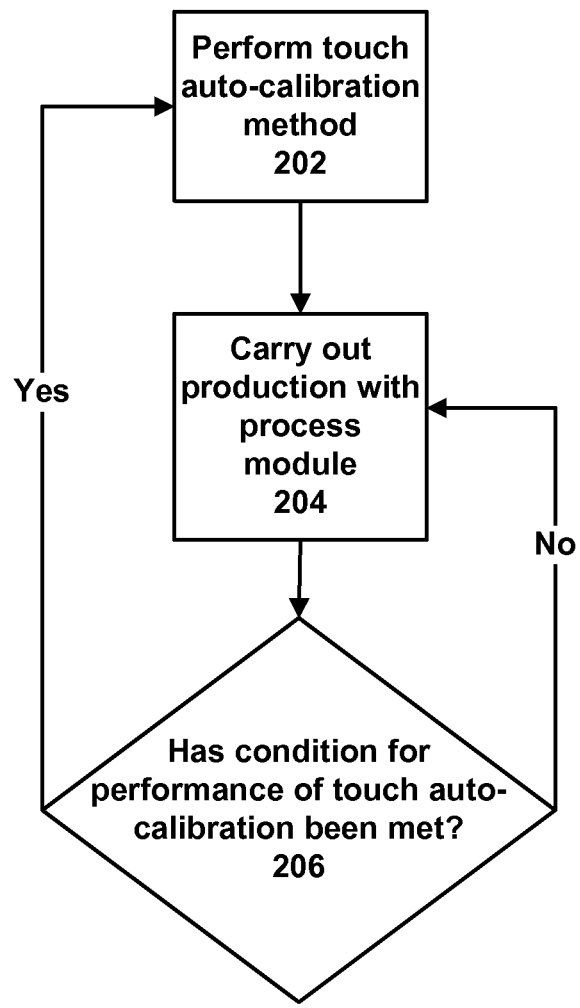
FIG. 2 is a process flow sheet illustrating an example of a long-term schedule of operating a semiconductor process tool.

FIG. 2 is a process flow sheet illustrating an example of a long-term schedule of operating a semiconductor process tool. The process begins at block 202 when the touch auto-calibration method is performed on the semiconductor process tool prior to production. Examples of touch auto-calibration that may be performed at block 202 are described further below with reference to FIGS. 7, 8, and 9. After the semiconductor process tool is calibrated, production of substrates begins, as shown in block 204. Production continues until the condition for re-calibration has been met. This is shown in block 206. The condition for re-calibration may be any combination of a variety of factors. In certain implementations, these factors may include the time that has elapsed since the semiconductor process tool was last calibrated, the number of production cycles run since the last calibration, the number of defects detected in processed substrates, the occurrence of an unexpected event such as the application of a shock force to the semiconductor process tool, and other factors. When the condition is met, the process returns to block 202.

Figure 3:
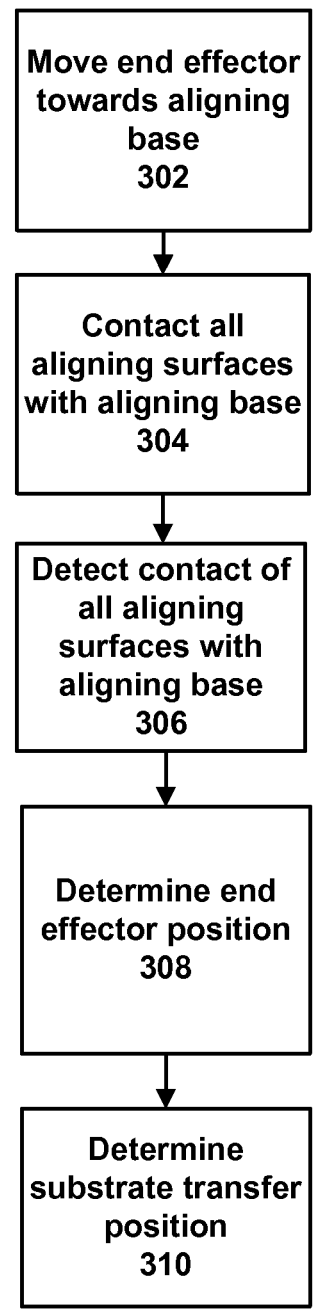
FIG. 3 is a process flow sheet illustrating an example of touch auto-calibration.

FIG. 3 is a process flow sheet illustrating an example of touch auto-calibration. Touch auto-calibration is configured to determine the position at which an end effector will pick and place substrates during production. In block 302, an end effector is being moved towards an aligning base. While the description below refers chiefly to a pedestal within a process module as an aligning base, other substrate support destinations may be used as appropriate for the particular implementation. The direction for the path of the end effector in block 302 can be one that will roughly allow the end effector to be close to passing over the position that the end effector should be at to pick or place substrates during production.

As the end effector is moved, aligning surfaces on the end effector contact the aligning base. In certain implementations, the end effector is configured to self-align to a new angular direction after contacting the aligning base. The aligning surfaces are configured to halt the movement of the end effector after all aligning surfaces are fully in contact with the aligning base, as shown in block 304. Examples of aligning surfaces on an end effector are discussed further below with reference to FIGS. 11A-11D. Once the aligning surfaces are fully in contact with the aligning base, the contact is detected in block 306. Examples of methods of detecting contact are described further below with reference to FIGS. 7 and 8.

As illustrated by block 308, once all aligning surfaces are fully in contact with the aligning base, the end effector's position is determined. In some implementations, block 308 can involve determining one or more placement coordinates of the end effector. Block 310 further illustrates that after determining the end effector's position, a substrate transfer position is determined from the end effector's position. The substrate transfer position is the position at which the end effector places and/or picks substrates during production. Determining the substrate transfer position can involve calculating a placement correction. In certain implementations the end effector and aligning base are configured such that when the aligning surfaces are fully in contact with the aligning base, the end effector is positioned a distance away from where the end effector should be during the actual production process to pick or place the substrate. In such implementations, the placement correction is determined to help determine the position the end effector should move to during the actual production process. Consequently, the position where the end effector will move to pick or place substrates during production can be determined by taking the position of the end effector upon contact of all aligning surfaces with the aligning base and applying a placement correction (if any). In other implementations, the end effector and the aligning base are fully in contact when the end effector has substantially reached the position the end effector should be in during the production process to pick or place the substrate. In such implementations, the placement correction value may be zero. In additional implementations, the placement correction may be calculated with factors to compensate for environmental conditions. For example, the placement correction may have factors to compensate for the difference in ambient temperature during performance of touch auto-calibration compared to during production. The placement correction may also have factors to compensate for additional environmental conditions, such as the pressure of the environment.

FIGS. 4A-4D are graphical representations of a certain implementation of a robot arm with an end effector containing aligning surfaces and an aligning base at certain stages of touch auto-calibration. In this implementation, as shown in FIG. 4A, the main components of robot arm 116 are end effector 106, first robot arm link 140, second robot arm link 142, and link pivot 448. First robot arm link 140 and second robot arm link 142 are configured to articulate in the theta direction around link pivot 448. During the touch anti-calibration process, link pivot 448 is configured to allow first robot arm link 140 and second robot arm link 142 to articulate according to external force, i.e. link pivot 448 is in a loose configuration during touch auto-calibration to allow external forces to reposition first robot arm link 140 and second robot arm link 142. In this implementation, there are two aligning surfaces on robot arm 116: aligning surfaces 408a and 408b. Point 444 is a point on end effector 106 that is configured to align with corresponding point 446 on aligning base 412 when end effector 106 is picking or placing substrates during production. Point 444 is aligned with point 446 when the projection of point 444 onto aligning base 412 in the direction of the view shown in FIG. 4A is substantially coincident with point 446. Substantially coincident refers to being aligned to within a certain tolerance. Aligning surfaces 408a and 408b are configured to interact with aligning base 412 to align the end effector during the touch auto-calibration process. Aligning base 412 may be any configuration known to a person with ordinary skill in the art, including aligning bases that are circular in shape.

FIG. 4A is a step of touch auto-calibration as used in certain implementations. In FIG. 4A, the motor may be exerting aligning force 450 on robot arm 116. Aligning force 450 is driving robot arm 116 towards aligning base 412. In FIG. 4A, end effector 106 has not yet contacted aligning base 412 at any point. Thus, link pivot 448 is still at an angle of theta 454a, the initial angle set at the start of the touch auto-calibration process. Theta 454a is shown as $\Theta_1$ in FIG. 4A. In FIG. 4A, the aligning force 450 may be exerting a substantially linear force on end effector 106.

FIG. 4B shows a further step of touch auto-calibration after FIG. 4A. In FIG. 4B, aligning surface 408a on end effector 106 has contacted aligning base 412 at point 452. Aligning surface 408b has not yet contacted aligning base 412 due to misalignment of robot arm 116 relative to the aligning base during the initial alignment prior to performing the touch auto-calibration process. Point 452 effectively functions as a pinned joint for robot arm 116. Thus in FIG. 4B aligning force 450 may now exert both a linear force and a rotational moment 450a on end effector 106.

FIG. 4C is a further step of touch auto-calibration after FIG. 4B. In FIG. 4C, rotational moment 450a from the step in FIG. 4B has rotated end effector 106 so that aligning surface 408b has also contacted aligning base 412. The increased resistance in the movement of robot arm 116 from contact of both aligning surfaces results in a change in torque outputted by the motor driving robot arm 116. In the example of FIG. 4C, a controller can detect the change in torque outputted and thus detect the contact of all aligning surfaces. In other implementations, the controller may detect contact of all aligning surfaces from the difference between a commanded position of the end effector and the actual position of the end effector.

After detection of the contact of all aligning surfaces, a placement coordinate of end effector 106 can be determined. A placement coordinate may indicate the position of the end effector 106 in a particular frame of reference. For example, in some implementations, the controller breaks down a placement coordinate of end effector 106 into two components: an angular component and a linear component. The rotation of end effector 106 has changed the angle of link pivot 448 to theta 454b. The controller detects the change of the theta angle to theta 454b. In the implementation shown, theta 454b is shown as $\Theta_2$ and is the angular component of the placement coordinate. Additionally, as part of this implementation of touch auto-calibration, point 444 is not aligned with point 446 when aligning surfaces 408a and 408b are in contact with aligning base 412. The linear distance between points 444 and 446 is detected by the controller and the linear distance is the linear component of the placement coordinate. Detection of the linear distance may be accomplished through any method well known to a person having ordinary skill in the art, including through position sensors on the robot arm and aligning base, through position sensors mounted elsewhere, or through calculations based on the geometry of the aligning surfaces and the aligning base. In some implementations, the distance may be known and/or stored in a storage medium.

FIG. 4D shows a step in touch auto-calibration after FIG. 4C. After the determination of the placement coordinate of end effector 106, the controller then determines a substrate transfer position at which the end effector will be for substrate place and/or pick moves. In some implementations, this involves determining a placement correction. In this example, the placement correction is the amount end effector 106 must move from the placement coordinate for points 444 and 446 to substantially align. Substantial alignment refers to being aligned to within a certain tolerance. Depending on the implementation, the placement correction can be an angular correction, a linear correction, or both angular and linear corrections. In this implementation, the placement correction contains both a linear correction and an angular correction.

The placement correction in this implementation requires that the end effector be moved linearly until points 444 and 446 are substantially aligned. Aligning surfaces 408a and 408b are configured to halt movement of end effector 106 when both aligning surfaces contact aligning base 412. The geometry of the aligning surfaces and the aligning base is configured so that movement is always halted when point 444 is a linear distance within a tolerance from point 446. An example linear tolerance in the horizontal plane is +/−0.010" in both dimensions. In this example, the placement correction to move the end effector is this linear distance. The end effector does not move angularly when the placement correction is applied as aligning surfaces 408a and 408b are configured to align end effector 106 so that the axis formed by connecting point 444 and the rotational axis of link pivot 448 comes within a tolerance of point 446. However, application of the placement correction to the placement coordinate may result in a corrected theta angle of link pivot 448 to 454c since the theta angle is not at 90 degrees and thus linear movement of the end effector will result in a change in theta angle of link pivot 448. The corrected theta angle 454c is shown as $\Theta_3$.

Figure 5:
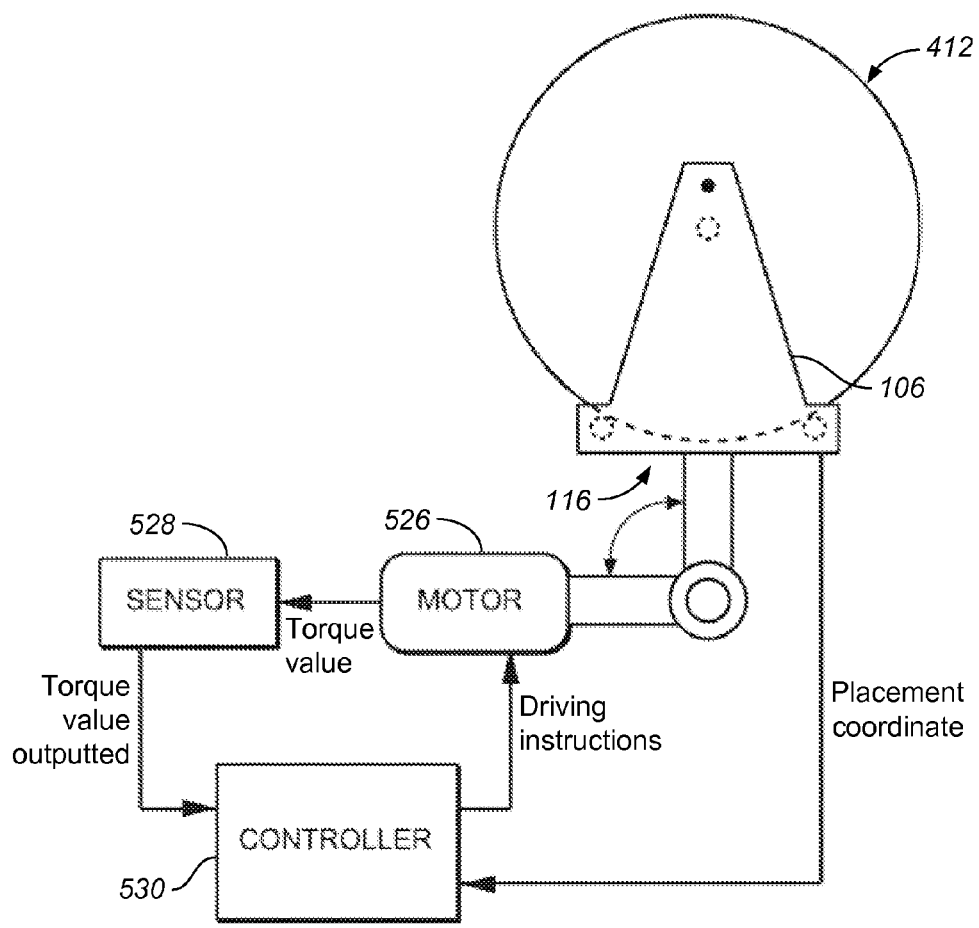
FIG. 5 is a process flow diagram illustrating certain components of a touch auto-calibration system in a certain implementation.

FIG. 5 is a process flow diagram illustrating certain components of a touch auto-calibration system in a certain implementation. In this implementation, the touch auto-calibration system includes a controller 530, which controls some or all of the operations of the touch auto-calibration process. In various implementations, controller 530 may be integrated into a controller that also controls other functions of the semiconductor process tool, or it may be a separate controller configured only to perform the touch auto-calibration system. Controller 530 will typically include one or more processors and one or more memory devices. The processors may include a central processing unit (CPU) or computer, analog and/or digital input/output connections, stepper motor controller boards, and other like components. Instructions for implementing appropriate control operations are executed on the one or more processors. These instructions may be stored on the memory devices associated with the controller or they may be provided over a network. In certain implementations, the system controller executes system control software. The system control logic may include instructions for controlling motor 526 and/or robot arm 116.

System control logic may be configured in any suitable way. In general, the logic used to control the touch auto-calibration system can be designed or configured in hardware and/or software. In other words, the instructions for controlling the drive circuitry may be hard coded or provided as software. It may be said that the instructions are provided by "programming". Such programming is understood to include logic of any form including hard coded logic in digital signal processors, application specific integrated circuits, and other devices which have specific algorithms implemented as hardware. Programming is also understood to include software or firmware instructions that may be executed on a general purpose processor. System control software may be coded in any suitable computer readable programming language.

Various process tool component subroutines or control objects may be written to control operation of the process tool components necessary to carry out various process tool processes. In some implementations, system control software includes input/output control (IOC) sequencing instructions for controlling the various parameters described herein. For example, each phase of the touch auto-calibration process may include one or more instructions for execution by the system controller. The instructions for setting process conditions for contact detection may be included in a corresponding detection phase. In certain implementations, the detection phase may include multiple instructions for detecting multiple instances of contact.

Other logic implemented as, for example, software programs and routines may be employed in some implementations. An example of programs or sections of programs for this purpose is a robot arm positioning program which controls the positions of the robot arm through drive instructions for the motor. Another example of such programs is a program for calculating the placement correction after contact is detected.

In some implementations, there may be a user interface associated with the system controller. The user interface may include a display screen, graphical software displays of the apparatus and/or process conditions, and user input devices such as pointing devices, keyboards, touch screens, microphones, etc.

In some implementations, parameters adjusted by the system controller may relate to process conditions. Non-limiting examples include the speed the end effector is driven, the temperature and pressure of the process chamber during touch auto-calibration, the torque value required for the controller to detect contact, etc. These parameters may be provided to the user in the form of a recipe, which may be entered utilizing the user interface.

Signals for monitoring the process may be provided by analog and/or digital input connections of the system controller from various process tool sensors. The signals for controlling the process may be outputted on the analog and digital output connections of the process tool. Non-limiting examples of process tool sensors that may be monitored include motor controllers, torque value sensors, position sensors, shock sensors, thermal sensors, pressure sensors, etc. Appropriately programmed feedback and control algorithms may be used with data from these sensors to maintain process conditions.

Motor 526 is configured to position robot arm 116 during the touch auto-calibration process. Robot arm 116 may be directly driven by motor 526 or be driven through drive connections such as pulley systems, gears, actuators, or other systems. Motor 526 may or may not be the motor that drives robot arm 116 during substrate production. Motor 526 may be any type of motor well known to a person having ordinary skill in the art that may be configured to position a robot arm such as variable speed stepper motors.

In certain implementations, sensor 528 is configured to detect the torque outputted by motor 526 to move robot arm 116. In various implementations, sensor 528 may be any type of torque sensor that is capable of measuring torque at the motor or at the arm. Sensor 528 may also be configured to have any number of sampling rates for the torque outputted by motor 526. In other implementations, sensor 528 is configured to detect the position of the end effector. In various implementations, sensor 528 may be any type of sensor which is capable of detecting the position of the end effector. Sensor 528 may be a separate sensor, or it may be integrated into controller 530 or another component within the semiconductor process tool.

Sensor 528 is also configured to output the torque value of motor 526 to controller 530. The torque value outputted to controller 530 can then be used to determine whether end effector 106 has contacted aligning base 412. In some implementations, controller 530 is configured to detect a baseline torque value. This baseline torque value will be the torque outputted by motor 526 when motor 526 is driving robot arm 116 and there is no contact between end effector 106 and aligning base 412. Controller 530 may have logic configured to detect contact through a change in the torque value. The amount of change in the torque value needed to detect contact may be a range of possible values. In certain implementations, the controller will be configured to detect contact between the aligning surfaces and the aligning base when the torque outputted by motor 526, as detected by sensor 528, increases by at least 50% over the baseline torque (1.5× the nominal torque). Other implementations may not detect contact between the aligning surfaces and the aligning base until the torque outputted has increased by 300% or as high as 1000% of the baseline torque (3× to 10× the nominal torque). In other implementations, the controller will be configured to detect contact between the aligning surfaces and the aligning base when the commanded position and the actual position of the end effector deviate by a set distance in the x direction, a set distance in the y direction, or a set magnitude.

Aligning base 412 may be directly or indirectly connected to a semiconductor wafer pedestal. After contact is detected, controller 530 contains logic to determine the location of end effector 106. The translational position of the end effector as well as the angular orientation of the links of the robot arm may be determined through any method known to one having ordinary skill in the art including the use of sensors that can detect translational position, the use of sensors that can detect angular orientation, the use of high resolution cameras, and other methods. In certain implementations, end effector 106 is configured to self-align to a new angular direction after contacting aligning base 412. This new angular direction can then be adopted as the angular direction the end effector will use to approach the semiconductor wafer pedestal during production. In certain implementations, the point of contact between end effector 106 and aligning base 412 is configured to be beyond the position where it would be during substrate position, to prevent contact of the aligning surfaces with the aligning base during production and minimize particle generation. In such implementations, controller 530 can be configured to calculate a placement correction after contact between end effector 106 and aligning base 412 is detected. The placement correction is then applied to the position where end effector 106 contacts aligning base 412 (i.e. the placement coordinate) to determine the position where end effector 106 should pick and place substrates during production.

Figure 6:
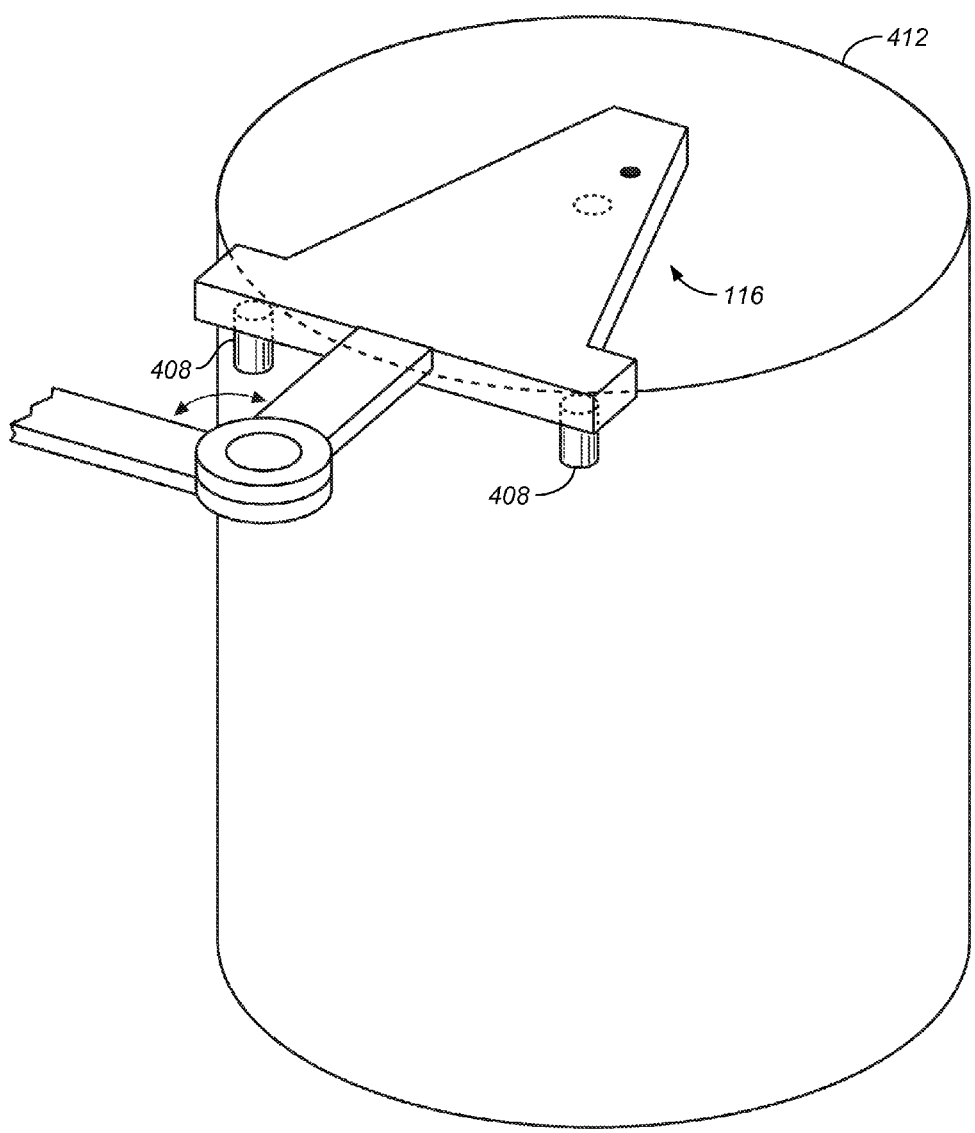
FIG. 6 is an example of a robot arm with an end effector containing aligning surfaces and an aligning base.

FIG. 6 is an example of a robot arm with an end effector containing aligning surfaces and an aligning base. FIG. 6 shows an end effector 106 along with an aligning base 412. End effector 106 contains aligning surfaces 408, which are configured to align end effector 106 upon contact with aligning base 412. In this implementation, aligning surfaces 408 are two pins. In other implementation, the aligning surfaces may be a variety of other shapes and/or mechanisms configured to align the end effector. End effector 106 is aligned through the moment that results from one of the two pins of aligning surfaces 408 contacting aligning base 412.

Figure 7:
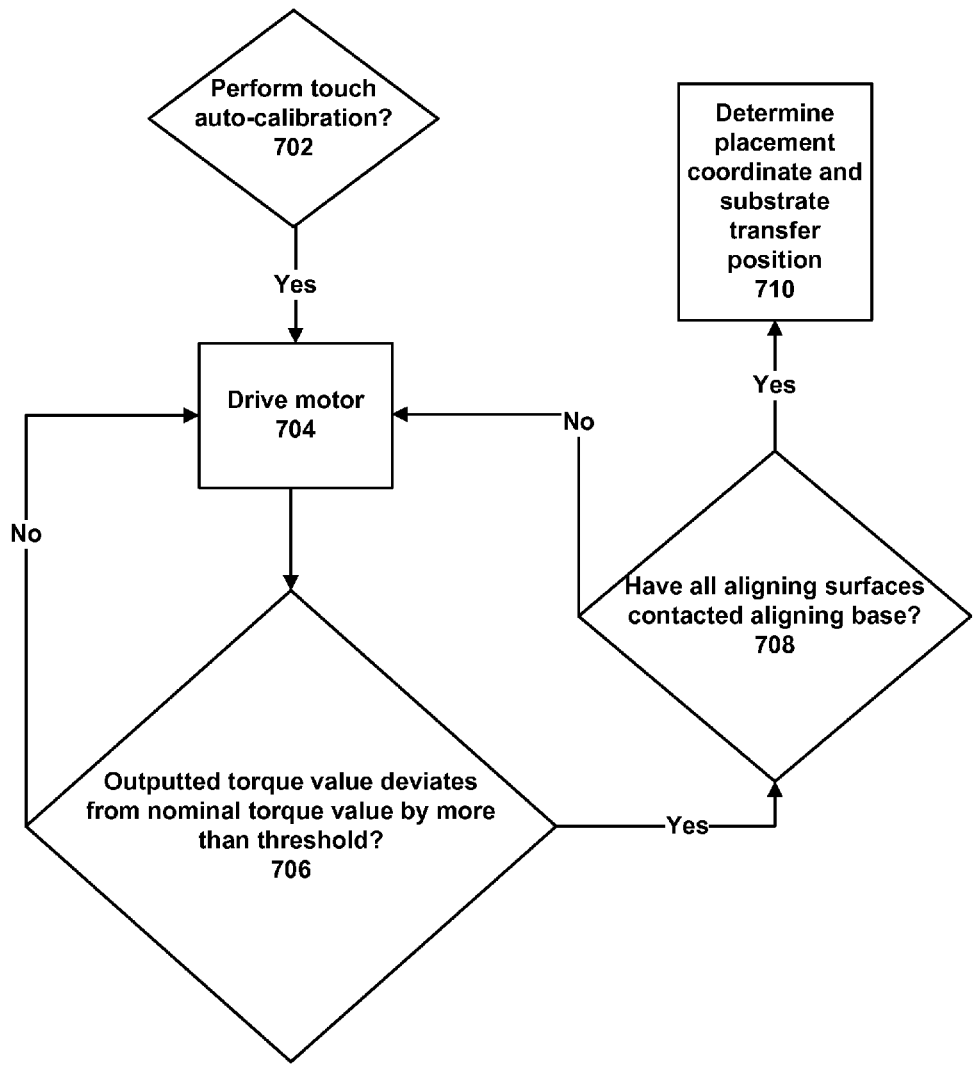
FIG. 7 is a process flow diagram illustrating an example of the interplay between different components in touch auto-calibration.

FIG. 7 is a process flow diagram illustrating an example of a sequence of steps performed by the controller in touch auto-calibration. In block 702, the controller determines whether touch auto-calibration is to be performed. The command to perform touch auto-calibration can be from an internal source, such as a command from the controller after the controller determines that a set time period has passed since the last touch auto-calibration was performed, from an external source, such as a command from an operator, or from a combination of internal and external sources.

If the controller determines that touch auto-calibration is to be performed, then the controller commands the motor to drive the end effector towards the aligning base in block 704. After the controller commands the motor to drive the end effector, it then proceeds to block 706.

Block 706 shows that the sensor measures the torque outputted by the motor when the motor drives the end effector. The sampling rate of the sensor may be any effective sampling rate, such as, depending on the speed of the motion and the duration of the sampling, between about 100-10000 Hz. The sensor outputs the measured torque value to the controller. The controller monitors the torque value outputted by the sensor and compares the torque value with the nominal torque value. If the outputted torque value deviates from the nominal value past a certain threshold, then the process continues to block 708 where the controller determines that there is contact between the aligning surfaces and the aligning base. If the outputted torque value is within the threshold value, then the controller continues providing instructions for the motor to drive the end effector towards the aligning base.

In block 708, the controller determines whether all aligning surfaces have contacted the aligning base. As discussed below with respect to FIG. 8, in certain implementations, there may be only a single threshold torque value or multiple threshold values. If there is a single threshold torque value, then that threshold torque value can be configured to correspond to a level where the increase in outputted torque by the motor indicates that all aligning surfaces have contacted the aligning base. Thus, in those implementations, once the single threshold torque value has been exceeded, then the controller determines that all aligning surfaces have contacted the aligning base.

If there are multiple threshold torque values, then there can be a threshold torque value configured to correspond to a level where the increase in outputted torque by the motor indicates that all aligning surface have contacted the aligning base. If the torque outputted by the motor has exceeded the threshold torque value configured to correspond to when all aligning surfaces have contacted the aligning base, then the controller determines that all aligning surfaces have contacted the aligning base. Otherwise, the controller continues providing instructions for the motor to drive the end effector towards the aligning base.

After the controller determines that all aligning surfaces have contacted the aligning base, the controller then determines the placement coordinate of the end effector, as outlined in block 710. The placement coordinate may be determined through any technique known to a person having ordinary skill in the art. These techniques include, but are not limited to, optical position sensors, high definition cameras, calculations based on the geometry of the aligning surfaces and the aligning base, weight sensors, vacuum sensors, and other techniques.

In addition, the controller also determines a substrate transfer position using the placement coordinate as outlined in block 710. Determining the substrate transfer position can involve calculating a placement correction. Depending on the implementation, the placement correction can be an angular correction, a linear correction, both angular and linear corrections, or no correction at all. The placement correction can be determined through any technique known to a person having ordinary skill in the art. These techniques include, but are not limited to, determining the position of the end effector through position sensors and comparing the position with the desired position for the end effector, having the geometry of the aligning surface and the aligning base guide the end effector to a known end position with a set placement correction, and other techniques.

Figure 8:
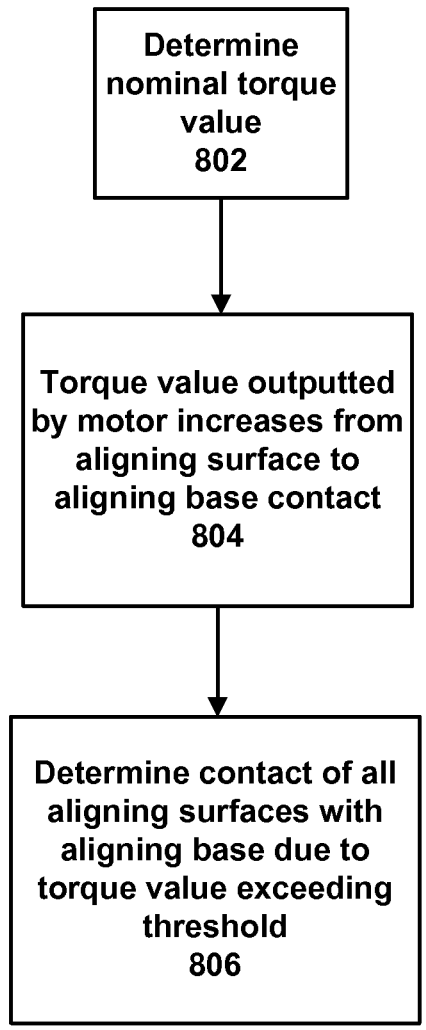
FIG. 8 is a process flow diagram illustrating an example of a sequence of steps performed by the controller in touch auto-calibration.

FIG. 8 is a process flow diagram illustrating an example of a sequence of steps utilized for contact detection for touch auto-calibration. In block 802, a nominal value for the torque outputted by the motor is determined. The nominal value may either be determined before or during touch auto-calibration. The nominal value can be determined through a variety of ways before the touch auto-calibration process such as, but not limited to, consultation with the specifications of the motor's specification, through independent testing of the motor, through the input of a specific value into the controller's memory, or through any other way well known to a person having ordinary skill in the art. The nominal torque may also be determined during touch auto-calibration through a variety of methods such as, but not limited to, spot detection of the torque outputted during a baseline or sample motion or averaging the torque outputting by the motor through a set time period during a baseline or sample motion. In certain implementations of touch auto-calibration, the set time period for averaging the torque outputted may be less than the time period estimated for any aligning surface to contact the aligning base. For example, if a first aligning surface is estimated to contact the aligning base two seconds after the start of the touch auto-calibration process, then the time period for averaging the torque outputted may be less than two seconds. In certain implementations, the time period for detecting the torque outputted to be averaged into a nominal value may be from a time period before any contact between the end effector and the aligning base is estimated to occur.

As the motor drives the end effector towards the aligning base, the sensor measures the torque outputted by the motor and outputs the torque value to the controller. As illustrated in block 804, as the end effector makes contact with the aligning base, the torque value outputted by the motor increases due to the extra resistance to movement of the end effector. During the movement of the end effector, the controller compares the torque value with the nominal torque value.

If the torque value exceeds a threshold torque value, then the controller determines that there is contact between an aligning surface and the aligning base as in block 806. Depending on the implementation, the threshold torque value may be set anywhere in the range of between 50% to 1,000% higher than the baseline torque value. Also as discussed above, depending on the implementation, there may be multiple thresholds in order to detect contact of one, some or all aligning surfaces with the aligning base. For example, if the implementation has two aligning surfaces, there may be two thresholds: a first threshold to detect contact of the first aligning surface with the aligning base and a second threshold to detect contact of the second aligning surface with the aligning base. In this example, the first threshold may be a torque value 30% higher than the nominal torque value and the second threshold may be a torque value 100% higher than the nominal torque value. In other implementations, the deviation required to detect contact of various aligning surfaces may be different threshold values.

Depending on the implementation, there may be a single threshold torque value to only detect contact of all the aligning surfaces with the aligning base, or there may be multiple threshold torque values to detect contact of one, some, or all of the aligning surfaces with the aligning base. If there are multiple threshold torque values, then the process may be repeated until contact of all aligning surfaces with the aligning base has been detected.

Figure 9:
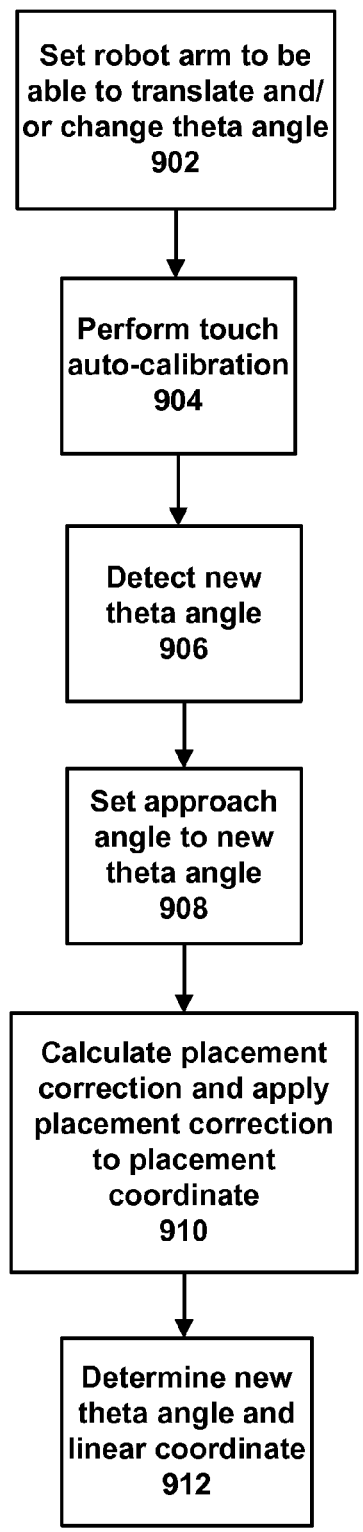
FIG. 9 is a process flow diagram illustrating an example of certain steps taken in calculating a placement correction in touch auto-calibration.

FIG. 9 is a process flow diagram illustrating an example of certain steps taken in calculating a placement correction in touch auto-calibration. As illustrated in block 902, in certain implementations, the robot arm is configured so that it is set to be able to either translate, change theta angles, or both from external forces such as contact with the aligning base. The robot arm may be loosened to translate, change theta angles, or both before touch auto-calibration is performed.

In block 904, the components of the semiconductor process tool carries out the touch auto-calibration process. Block 904 can include the driving of the end effector towards the aligning base, the contact of all aligning surfaces with the aligning base, the detection of contact of all aligning surfaces with the aligning base, and the calculation of the placement coordinate of the end effector after all aligning surfaces have contacted the aligning base. In this implementation, the placement coordinate includes a linear component and an angular component.

In this implementation, the robot arm compliance is increased so that the theta angle may be changed through direct contact with the aligning base. After contact of all aligning surfaces with the aligning base has been detected, the controller is configured to detect the new theta angle of the robot arm after contact, as shown in block 906. The new theta angle may be detected through one or more motor positions measured using an internal or external motor encoder, wherein additional kinematic interpretation of motor position may be required, or through an external sensor measuring the robot theta angle.

After the new theta angle is detected, the controller then proceeds to block 908. In block 908, the controller resets the angle of approach the robot arm uses in production to be the new detected theta angle. Thus, in production, the robot arm will replicate the new theta angle, which is the theta angle of the robot arm after all aligning surfaces have contacted the contacted base.

Also after detection of contact of all aligning surfaces with the aligning base, the controller calculates a placement correction. Block 910 applies the placement correction to the placement coordinate determined in block 904. In this implementation, the placement correction contains only a linear component since the theta angle of the robot arm is corrected through the geometry of the aligning surfaces and the aligning base in block 908. Thus, the controller applies only the linear component of the placement correction to the placement coordinate in this implementation. In other implementations, the placement correction may contain both a linear component and an angular component.

Block 912 shows that for this implementation, the theta angle used by the robot arm during production is the theta angle determined in block 908. The linear coordinate the robot arm is configured to move to during production is the placement coordinate with the placement correction applied in block 910.

FIGS. 10A and 10B show an example of an end effector with aligning surfaces used in a touch auto-calibration method. In this implementation, end effector 106 has two aligning surfaces: aligning surface 408*a* and aligning surface 408*b*. In other implementations, there may be as few as one aligning surface or three or more aligning surfaces. End effector 106 is configured to hold a substrate on a first surface 1056. In FIG. 10A, the viewer sees the end effector from below, i.e., an angle which the viewer may see the end effector if the viewer looks at the end effector from the aligning surface. In FIG. 10A, first surface 1056 is the surface of the end effector not visible to the viewer and is the surface of the end effector 106 farther away from the aligning surface. In this implementation, the aligning surfaces are mounted on a second surface 1058 that is opposite from the first surface 1056. Second surface 1058 is visible to the viewer in FIG. 10A and is the surface of end effector 106 closer to the aligning surface. Other implementations may have the aligning surfaces mounted on the first surface, or on another surface not opposite from the first surface.

FIG. 10B shows an end effector 106 holding a substrate 1074 represented by a circle with broken lines. First projected area 1060 is the orthogonal projection of substrate 1074 on end effector 106. In this implementation, aligning surfaces 408*a* and 408*b* are configured to be set back from the projection of first projected area 1060 so as to avoid having aligning surfaces 408*a* and 408*b* contact the aligning base during normal production. In this implementation, aligning surfaces 408*a* and 408*b* are configured to only contact the aligning base during touch auto-calibration, when the end effector is deliberately driven past the location where it would be during normal production.

FIGS. 11A-11D are examples of various different aligning surface configurations for end effectors used in touch auto-calibration. Certain implementations of aligning surfaces will have the areas that are configured to contact the aligning base tangent to the aligning base. This will allow the end effector to rotate upon contact of the aligning surface with the aligning base and correct the angle of approach of the end effector.

FIG. 11A is an example of a single aligning surface configuration. Aligning surface 1162 has an inside surface 1164 which is configured to be an arc matching the radius of a round aligning base. In other implementations, inside surface 1164 may not match the radius of the aligning base. The aligning surface in FIG. 11A is configured to first contact the aligning base at a point along inside surface 1164. After first contact, the point of contact of inside surface 1164 to the aligning base creates a moment, as outlined in the description for FIG. 4B. The moment then rotates the end effector until at least two points, and possibly the entire inside surface 1164 contacts the aligning surface.

FIG. 11B is an example of a dual aligning surface configuration. Aligning surfaces 1166a and 1166b are round pins. The implementation in FIG. 11B is configured so that the force vector from the motor driving the end effector passes through the line formed by connecting aligning surfaces 1166a and 1166b. As configured, if there is an angular misalignment during the approach of the end effector towards the aligning base, one of either aligning surfaces 1166a or 1166b will contact the aligning base first. Upon contact of one of the aligning surfaces, the constraint of the aligning surface contacting the aligning base and the force vector from the motor combine to rotate the end effector so that the other aligning surface will also contact the aligning base.

FIG. 11C replaces the round pins in FIG. 11B with roller bearings 1168a and 1168b. Roller bearings, or a similar design well known to a person having ordinary skill in the art, may reduce friction caused by the rotation of the end effector, thus reducing particle generation.

FIG. 11D is a dual aligning surface configuration with round pin 1170 and flat extrusion 1172. Flat extrusion 1172 is configured to be tangent to the aligning base when there is contact between flat extrusion 1172 and the aligning base. Additionally, other implementations may have two flat extrusions, or three or more aligning surfaces. The configuration in FIG. 11D aligns the end effector in substantially the same way as how the configurations in FIG. 11A-11C align the end effector. Either the round pin 1170 or the flat extrusion 1172 may contact the aligning base first, creating a moment that then rotates the end effector.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

What is claimed is:

1. A method comprising:
    moving an end effector, in a semiconductor process tool, with one or more aligning surfaces towards an aligning base until all of the one or more aligning surfaces are contacting the aligning base at the same time, wherein the one or more aligning surfaces are protrusions extending away from a first surface of the end effector;
    measuring a torque value applied by a motor operable to move the end effector;
    detecting contact of all of the one or more aligning surfaces with the aligning base from the torque value;
    determining, by a processor, a placement coordinate of the end effector when all of the one or more aligning surfaces are contacting the aligning base at the same time; and
    determining, by the processor, a substrate transfer position for the end effector using the placement coordinate.

2. The method of claim 1, wherein determining the substrate transfer position comprises applying a placement correction to the placement coordinate.

3. The method of claim 2, wherein the placement correction comprises an angular component.

4. The method of claim 2, wherein the placement correction comprises a linear component.

5. The method of claim 2, wherein a calculation for the placement correction comprises using a temperature value.

6. The method of claim 5, wherein the placement correction is calculated using a temperature value different from the ambient temperature when the method was performed.

7. The method of claim 2, further comprising moving the end effector by the placement correction.

8. The method of claim 1, wherein the end effector has two or more aligning surfaces.

9. The method of claim 1, wherein the end effector has two and only two aligning surfaces.

10. The method of claim 1, wherein the one or more aligning surfaces contact the aligning base only at tangent planes to the aligning base.

11. The method of claim 1, wherein the contact is detected from measuring a change in the torque value.

12. The method of claim 1, wherein the contact is detected from measuring a 50-1,000% increase in the torque value.

13. The method of claim 1, wherein the method is performed at an ambient temperature between 40 to 500 degrees Celsius.

14. The method of claim 1, wherein the method is performed at sub-atmospheric pressures.

15. The method of claim 1, wherein the aligning base is connected to a semiconductor wafer pedestal, and further comprising placing a substrate on the semiconductor wafer pedestal with the end effector at a location determined by applying a placement correction to the placement coordinate.

16. An apparatus comprising:
    an aligning base;
    an end effector in a semiconductor process tool, the end effector including one or more aligning surfaces, wherein the one or more aligning surfaces are protrusions extending away from a first surface of the end effector and are configured to contact the aligning base;
    a motor, wherein the motor is operable to move the end effector;
    a sensor, wherein the sensor is configured to measure a torque value of the motor used to move the end effector and output the torque value; and a controller comprising program instructions, including:
    code for moving the end effector toward the aligning base,
    code for receiving a torque value outputted by the sensor,
    code for detecting that contact is made by all of the one or more aligning surfaces with the aligning base at the same time based on the torque value,
    code for determining a placement coordinate of the end effector, and
    code for determining a substrate transfer position for the end effector using the placement coordinate.

17. The apparatus of claim 16, wherein the aligning surfaces are configured to:
    contact the aligning base during an alignment sequence;
    guide the end effector into a placement during the alignment sequence; and
    be outside a first area on the end effector wherein the first area is configured to lie over the aligning base when the end effector is holding a substrate.

18. The apparatus of claim 16, further comprising:
    a semiconductor wafer pedestal; and
    a process station, wherein:
        the aligning base is connected to the semiconductor wafer pedestal,
        the semiconductor pedestal is a part of the process station, and
        the aligning base, semiconductor wafer pedestal, process station, end effector, motor, sensor, and controller forms a semiconductor process tool.

19. A method comprising:
    moving an end effector, in a semiconductor process tool, with two or more aligning surfaces towards a commanded position, wherein the two or more aligning surfaces are protrusions extending away from a first surface of the end effector;
    measuring an actual position of the end effector;
    detecting contact of all of the two or more aligning surfaces with an aligning base from the difference between the commanded position and the actual position;
    determining, by a processor, a placement coordinate of the end effector when all of the two or more aligning surfaces are contacting the aligning base at the same time; and
    determining, by a processor, a substrate transfer position for the end effector using the placement coordinate.

20. The method of claim 1, wherein the protrusions extend away from the first surface of the end effector in a direction that has a directional component normal to and opposite a surface of the wafer configured to hold a substrate.

* * * * *